(12) United States Patent
Tian et al.

(10) Patent No.: US 9,707,571 B2
(45) Date of Patent: Jul. 18, 2017

(54) APPARATUS AND METHOD FOR SUPPLYING CHEMICAL SOLUTION ON SEMICONDUCTOR SUBSTRATE

(71) Applicant: Taiwan Semiconductor Manufacturing Co., Ltd, Hsin-Chu (TW)

(72) Inventors: Shih-Jhang Tian, Hsinchu (TW); Pei-Yi Su, Taichung (TW); Yi-Ming Dai, Hsinchu (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 0 days.

(21) Appl. No.: 14/585,550

(22) Filed: Dec. 30, 2014

(65) Prior Publication Data

US 2016/0184839 A1    Jun. 30, 2016

(51) Int. Cl.
*B05B 1/00* (2006.01)
*B05B 1/02* (2006.01)
*B05B 1/06* (2006.01)
*H01L 21/67* (2006.01)

(52) U.S. Cl.
CPC ............... *B05B 1/02* (2013.01); *B05B 1/06* (2013.01); *H01L 21/6708* (2013.01)

(58) Field of Classification Search
CPC ......... B05B 1/06; B05B 1/02; B05B 11/3077; H01L 21/6708
USPC ......................................... 239/589, 592, 601
See application file for complete search history.

(56) References Cited

U.S. PATENT DOCUMENTS

| | | | | |
|---|---|---|---|---|
| 2,925,224 A | * | 2/1960 | Cunningham | B05B 1/02 239/548 |
| 3,088,854 A | * | 5/1963 | Spies, Jr. | F23D 14/54 148/194 |
| 3,419,220 A | * | 12/1968 | Goodwin | B24C 5/04 175/340 |
| 2001/0032887 A1 | * | 10/2001 | Everett | G01F 11/44 239/1 |
| 2006/0008590 A1 | * | 1/2006 | King | H05K 3/125 427/421.1 |
| 2006/0175431 A1 | * | 8/2006 | Renn | C23C 18/06 239/296 |

* cited by examiner

*Primary Examiner* — Jason Boeckmann
(74) *Attorney, Agent, or Firm* — McClure, Qualey & Rodack, LLP

(57) ABSTRACT

A method of providing a liquid over a substrate is provided. The method includes providing the liquid over the substrate via a first opening of a flow path formed in a spray nozzle. The method further includes sucking back the liquid away from the first opening of the flow path. The method also includes holding the chemical solution in the flow path to keep a front surface of the chemical solution located in a tapered flow path section of the flow path.

20 Claims, 9 Drawing Sheets

APPARATUS AND METHOD FOR SUPPLYING CHEMICAL SOLUTION ON SEMICONDUCTOR SUBSTRATE

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. The fabrication processes include gap-filling processes, etching processes, photolithography processes, alignment processes, and the like. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
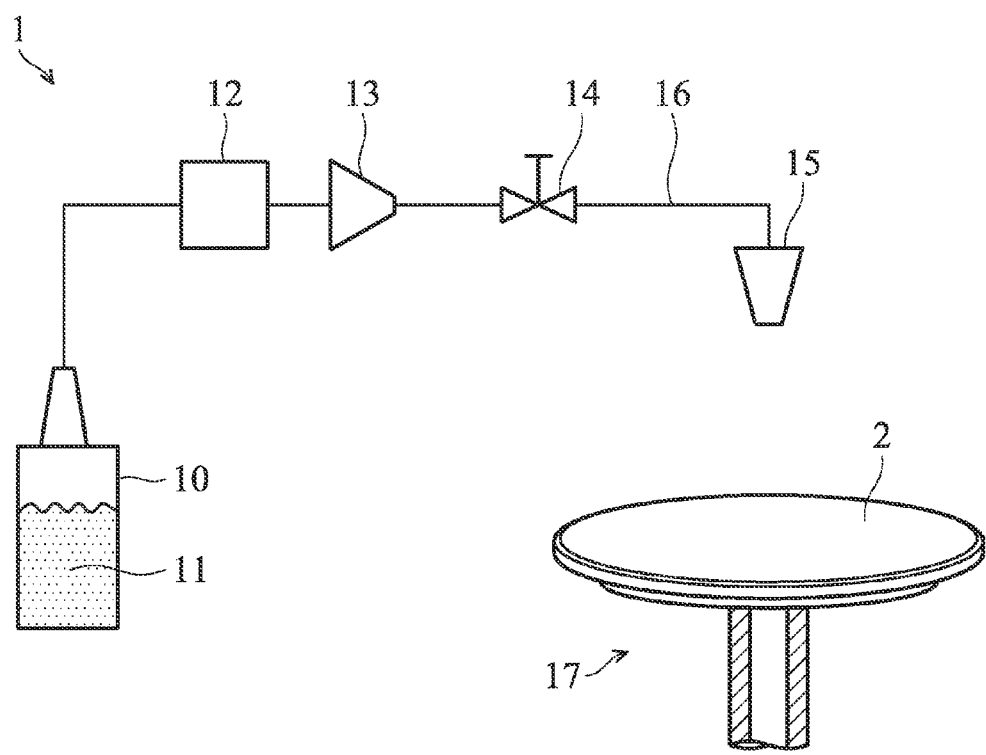
FIG. 1 shows a schematic view of an apparatus for providing a chemical solution on a substrate.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should understood that additional operations can be provided before, during, and after the method, and some of the operations described can be replaced or eliminated for other embodiments of the method.

FIG. 1 shows a schematic view of an apparatus 1 for providing a chemical solution 11 on a substrate 2. The apparatus 1 includes a storage unit 10, a pump 12, a filter 13, a valve 14, a spray nozzle 15, a conduit 16, and a substrate stage 17, in accordance with some embodiments. The elements of the apparatus 1 can be added to or omitted, and the disclosure should not be limited by the embodiments.

The substrate 2 may be made of silicon or other semiconductor materials. Alternatively or additionally, the substrate 2 may include other elementary semiconductor materials such as germanium (Ge). In some embodiments, the substrate 2 is made of a compound semiconductor such as silicon carbide (SiC), gallium arsenic (GaAs), indium arsenide (InAs), or indium phosphide (InP). In some embodiments, the substrate 2 is made of an alloy semiconductor such as silicon germanium (SiGe), silicon germanium carbide (SiGeC), gallium arsenic phosphide (GaAsP), or gallium indium phosphide (GaInP). In some embodiments, the substrate 2 includes an epitaxial layer. For example, the substrate 2 has an epitaxial layer overlying a bulk semiconductor. In some other embodiments, the substrate 2 may be a silicon-on-insulator (SOI) or a germanium-on-insulator (GOI) substrate.

The substrate may have various device elements. Examples of device elements that are formed in the substrate 2 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

In some embodiments, a chemical solution 11 is stored in the storage unit 10. The storage unit 10 may have a relatively large volume and may be used to store chemical solution for a relatively long period before being used in the semiconductor fabrication process. The chemical solution 11 may be a chemical used in a semiconductor fabrication process. In some embodiments, the chemical solution 11 includes chemical used in a photolithography process. For example, the chemical solution 11 may be a photoresist material.

In some embodiments, the photoresist material is a positive photoresist which can also be said to have a positive photoresist tone. A portion of the positive photoresist that is exposed to light becomes soluble to photoresist developer, and the other portion of the positive photoresist that is unexposed to light remains insoluble to the photoresist developer. In some embodiments, the photoresist material is a negative photoresist which can also be said to have a negative photoresist tone. A portion of the negative photoresist that is exposed to light becomes insoluble to the photoresist developer while the unexposed portion of the negative photoresist is dissolved by the photoresist developer. However, it should be appreciated that many variations and modifications can be made to the embodiments of the disclosure.

Several examples of the chemical solution 11 are described below. In some embodiments, the chemical solution 11 is a developer solution used for developing a photoresist. The developer solution may include a high-concentration developer such as Tetra-methyl-ammonium hydroxide (TMAH). The developer solution may alternatively include de-ionized water (DIW).

In some other embodiments, the chemical solution 11 is a functional chemical for improving the photoresist development process. For instance, the chemical solution 11 may be a surfactant for relieving photoresist surface tension, removing photoresist surface defects, or improving photoresist line width roughness. The surfactant may be an ionic surfactant or a non-ionic surfactant.

In still some other embodiments, the chemical solution 11 includes an acid such as HF or HCl for opening an under-layer of the photoresist. The under-layer may include a bottom anti-reflective coating (BARC) layer or a hard mask layer that is patterned with the photoresist. The chemical solution 11 may alternatively include a combination of the chemical solutions mentioned above.

In some embodiments, the apparatus 1 further includes a number of storage units used to store chemical solutions. The chemical solution in each storage unit may include the same type of chemical solution or distinctively different types of chemical solution. In addition, the storage units may be the same type or different types, as long as each storage unit is operable to store each of the chemical solution, respectively.

In some embodiments, the pump 12 receives chemical solution 11 from the storage unit 10 and pumps it to the spray nozzle 15 to apply the chemical solution 11 to the substrate 2. The pump 12 may be driven by a motor (not shown in figures) and may be a bellow-type pump such that a predetermined quantity of the chemical solution 11 can be pushed out through the spray nozzle 15 to the substrate 2.

In some embodiments, the valve 14 is positioned between the pump 12 and the spray nozzle 15. The valve 14 is configured to regulate the flow of the chemical solution 11 from the pump 12 to the spray nozzle 15. In some embodiments, the apparatus 1 further includes a host computer to control the valve 14 according to a predetermined setting. In some embodiments, the apparatus 1 also includes a sensor positioned in the conduit 16. The sensor senses a flow rate of the chemical solution 11 passing through the valve 14. If an overflow of chemical solution 11 to the substrate 2 occurs, the sensor sends out a signal to the host computer, stopping the chemical solution 11 from spraying on the substrate 2 by shutting off the valve 14.

In some embodiments, the filter 13 is operable to filter undesired particles from the chemical solution 11. The filter 13 can be positioned in any position of the conduit 16. In some embodiments, the filter 13 is positioned between the pump 12 and the valve 14. The pump 12 pressurizes the chemical solution 11 to the filter 13. After filtering, the chemical solution 11 is sent to the spray nozzle 15 via the valve 14.

Figure 2:
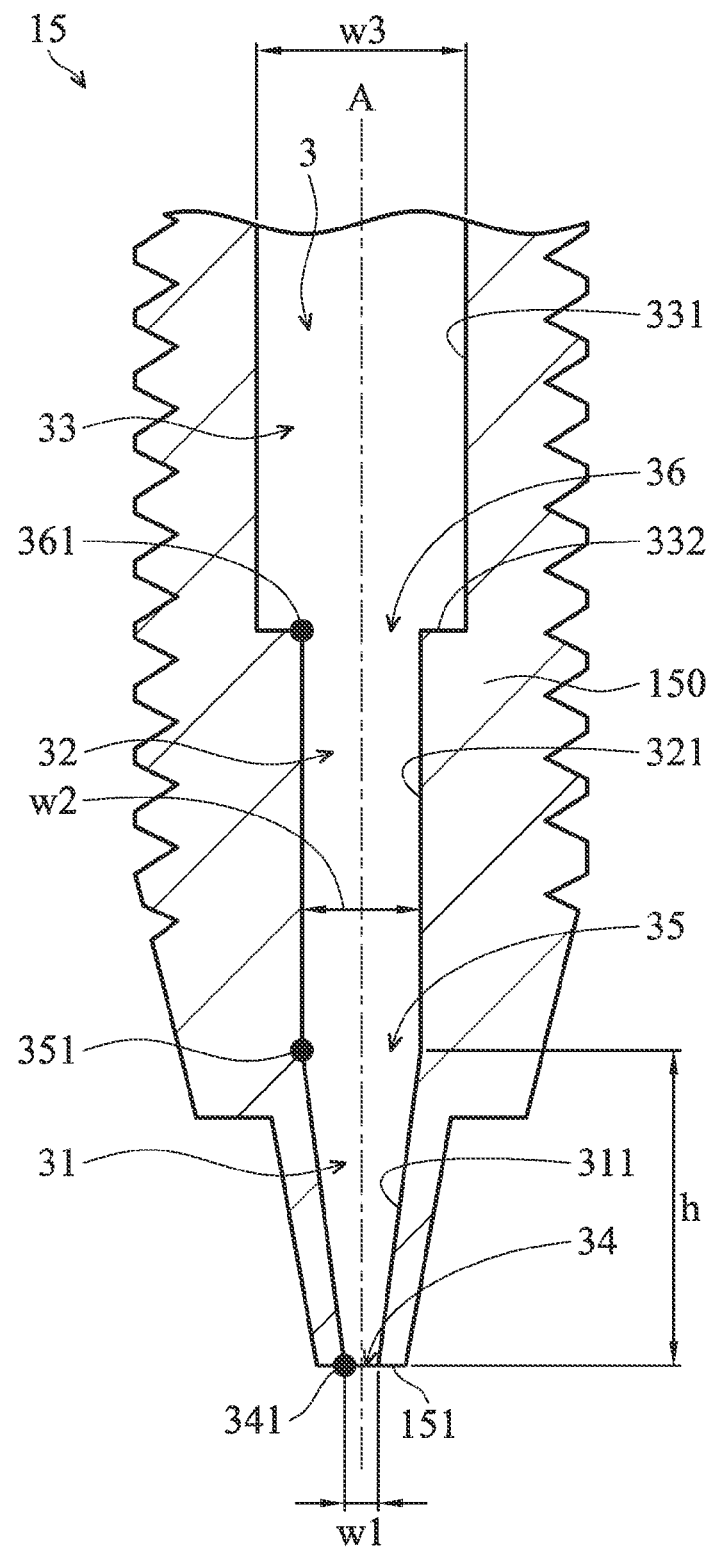
FIG. 2 shows a cross-sectional view of a nozzle, in accordance with some embodiments.

FIG. 2 shows a cross-sectional view of the spray nozzle 15, in accordance with some embodiments. In some embodiments, the spray nozzle 15 is connected to one end of the conduit 16 for supplying the chemical solution 11 from the conduit 16 onto the substrate 2.

In some embodiments, the spray nozzle 15 includes a main body 150. The main body 150 has a bottom surface 151 facing the substrate 2. The bottom surface 151 is the closest surface of the main body 150 to the substrate 2 while performing a chemical solution supplying process. The bottom surface 151 may be a plane. Alternatively, the bottom surface 151 may be an inclined surface with an increasing height along a direction approaching the center of the bottom surface 151. A first opening 34 is formed on the center of the bottom surface 151. The first opening 34 serves as an outlet opening of the nozzle 15 to supply the chemical solution 11.

In some embodiments, the spray nozzle 15 also includes a flow path 3 formed in the main body 150. The flow path 3 substantially extends along a longitudinal axis A. In some embodiments, the flow path 3 includes flow path sections for guiding the chemical solution 11, including a first flow path section 31, a second flow path section 32, and a third flow path section 33.

In some embodiments, the first flow path section 31 is connected to the first opening 34 formed on the bottom surface 151 of the main body 150. In some embodiments, the first flow path section 31 has a circular cross-section shape and includes an inner wall 311. The first flow path section 31 is tapered along the longitudinal axis A toward the first opening 34. A volume per unit length of the first flow path section 31 is increased in a linear manner away from the first opening 34 along the longitudinal axis A. As a result, the inner wall 311 is an inclined surface having an angle ranging from about 6 degrees to about 14 degrees relative to the longitudinal axis A.

In some embodiments, an opening edge 341 of the first opening 34 is immediately connected to the inner wall 311 of the first flow path section 31 and is immediately connected to the bottom surface 151 of the main body 150. In some embodiments, the diameter of the first opening 34 ranges from about 0.4 mm to about 1.2 mm. That is, a first width w1 of the first opening 34 (i.e. the outlet opening of the flow path section 31) along a direction perpendicular to the longitudinal axis A is in a range of about 0.4 mm to about 1.2 mm. However, it should be appreciated that many variations and modifications can be made to the embodiments of the disclosure.

The second flow path section 32 is connected to the first flow path section 31 via a second opening 35. In some embodiments, the second flow path section 32 has a circular cross-section shape and includes an inner wall 321. The second flow path section 32 has a constant width w2. Therefore, the inner wall 321 of the second flow path section 32 is parallel to the longitudinal axis A.

In some embodiments, an edge 351 of the second opening 35 is immediately connected to the inner wall 311 of the first flow path section 31 and is immediately connected to the inner wall 321 of the second flow path section 32. In some embodiments, the diameter of the second opening 35 ranges from about 1.21 mm to about 5 mm. That is, a second width w2 of the second opening 35 (i.e. the inlet opening of the flow path section 31) along a direction perpendicular to the longitudinal axis A is in a range of about 1.21 mm to about 5 mm. In some embodiments, a ratio of the second width w2 to the first width w1 is in a range from about 1.01 to about 12.5. However, it should be appreciated that many variations and modifications can be made to the embodiments of the disclosure.

The third flow path section 33 is connected to the second flow path section 32 via a third opening 36. In some embodiments, the third flow path section 33 is connected to the conduit 16 and configured to receive the chemical solution 11 from the conduit 16. In some embodiments, the third flow path section 33 has a circular cross-section shape and includes an inner wall 331 and a connecting wall 332. The third flow path section 33 has a constant width w3. Therefore, the inner wall 331 of the third flow path section 33 is parallel to the longitudinal axis A. The connecting wall 332 is perpendicular to the longitudinal axis A and connects the inner wall 331 of the third flow path section 33 to an edge 361 of the third opening 36. The edge 361 of the third opening 36 is immediately connected to the inner wall 321 of the second flow path section 32 and is immediately connected to connecting wall 332 of the third flow path section 33.

In some embodiments, the height h of the first flow path section 31 between the first opening 34 and the second opening 35 is determined according to the following equation:

$$V = \tfrac{1}{3}\pi(r^2 + rR + R^2)h$$

Here, the reference character "V" represents the volume of the first flow path section 31, the reference character "r" represents the radius of the first opening 34, the reference character "R" represents the radius of the second opening 35, and "h" represents the height of the first flow path section 31. In some embodiments, the volume of the first flow path section 31 is in a range of about 1.66 mm³ to about 84.93 mm³, and the height h of the first flow path section 31 is in a range from about 3 mm to about 10 mm. However, it should be appreciated that many variations and modifications can be made to the embodiments of the disclosure.

It is appreciated that the configuration of the spray nozzle 15 should not be limited to the above-mentioned embodiments, and the flow path 3 formed in the spray nozzle 15 can be modified as long as the flow path 3 includes a flow path section with tapered shape.

Figure 3:
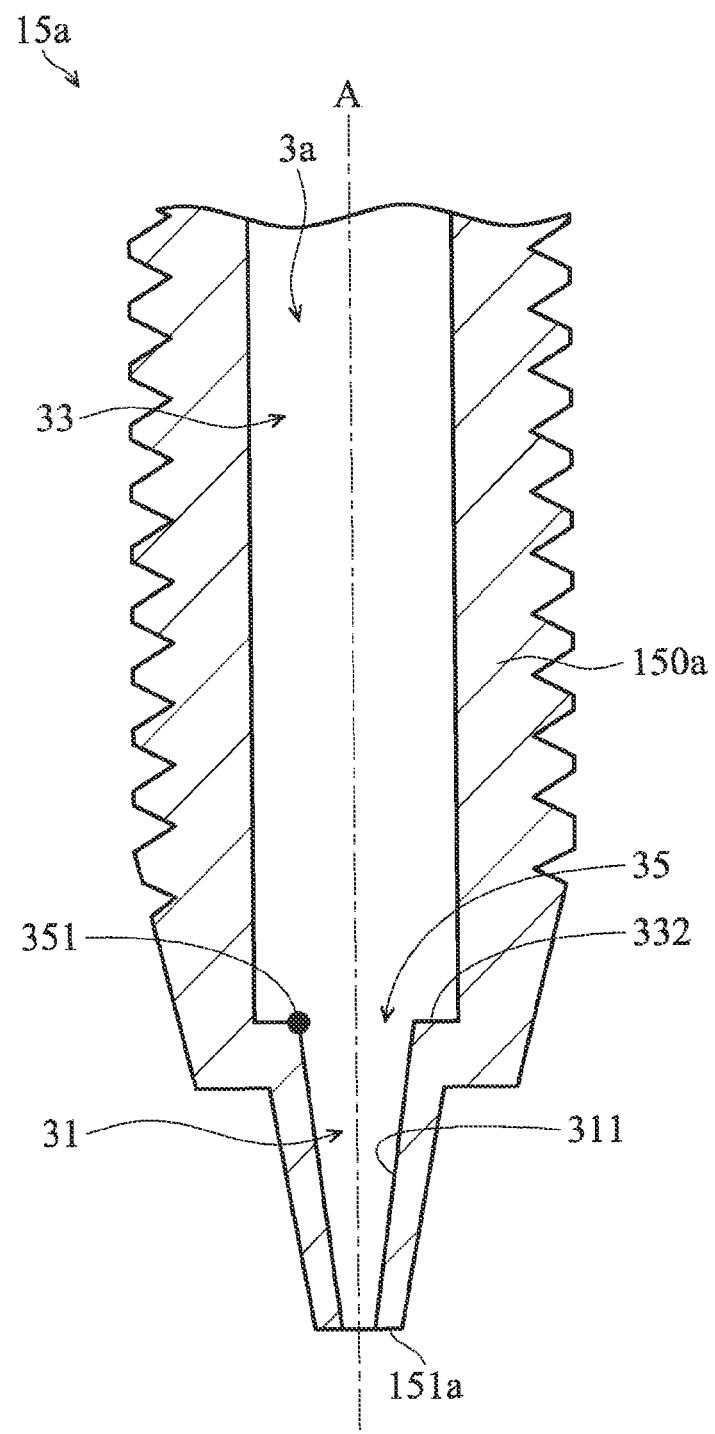
FIG. 3 shows a cross-sectional view of a nozzle, in accordance with some embodiments.

For example, as shown in FIG. 3, in some embodiments, a spray nozzle 15a includes a main body 150a and a flow path 3a formed in the main body 150a along the longitudinal axis A. Differences between the flow path 3a and the flow path 3 shown in FIG. 2 include the omission of the second flow path 32. The first flow path section 31 is connected to the first opening 34 formed on the bottom surface 151a of the main body 150a. The first flow path section 31 is connected to the third flow path section 33 via the second opening 35. The edge 351 of the second opening 35 is immediately connected to the inner wall 331 of the first flow path section 31 and is immediately connected to connecting wall 332 of the third flow path section 33.

In some embodiments, the main body 150 of the spray nozzle 15 is made of translucent or semi-transparent material. For example, the main body 150 is made of material such as polyethylene (PE), polyvinyl chloride (PVC), polytetrafluoroethene (PTFE), or any other suitable material. Therefore, the chemical solution 11 in the flow path 3 of the spray nozzle 15 can be visually observed by a machine operator. In some embodiments, the spray nozzle 15 is formed by a plastic injection molding process. In some embodiments, a number of recesses are formed at an outer surface of the main body 150, as shown in FIG. 2. The recesses are patterned according to a mold used in the plastic injection molding process.

Referring to FIG. 1, in some embodiments, the substrate stage 17 is configured for holding, positioning, moving, and otherwise manipulating the substrate 2. The substrate stage 17 is positioned relative to the spray nozzle 15 so as to allow the chemical solution 11 from the spray nozzle 15 to be sprayed on the substrate 2 arranged on the substrate stage 17. In some embodiments, the substrate 2 is secured on a substrate stage 17 by a clamping mechanism, such as vacuum clamping or e-chuck clamping. In some embodiments, the substrate stage 17 is further designed and configured to be operable for translational and rotational motions. In some embodiments, the substrate stage 17 is further designed operably to tilt or dynamically change the tilt angle.

Figure 4:
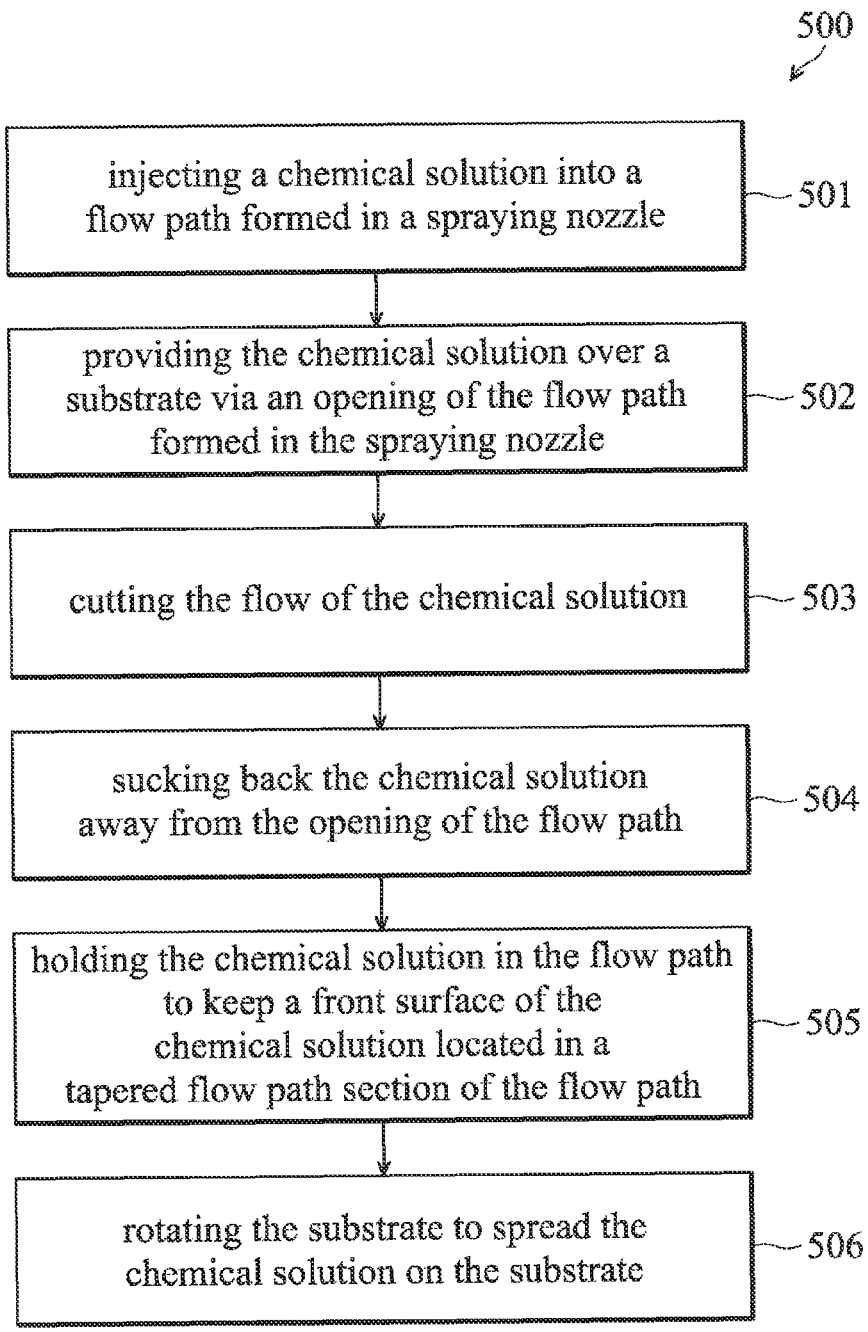
FIG. 4 is a flow chart showing a method of providing a chemical solution on a substrate, in accordance with some embodiments.

FIG. 4 is a flow chart illustrating a method 500 for forming a semiconductor device structure, in accordance with some embodiments. For illustration, the flow chart will be described in company with the schematic views shown in FIGS. 5A-5E. Some of the stages described can be replaced or eliminated for different embodiments. Additional features can be added in the semiconductor device structure. Some of the features described below can be replaced or eliminated for different embodiments.

Figure 5A:
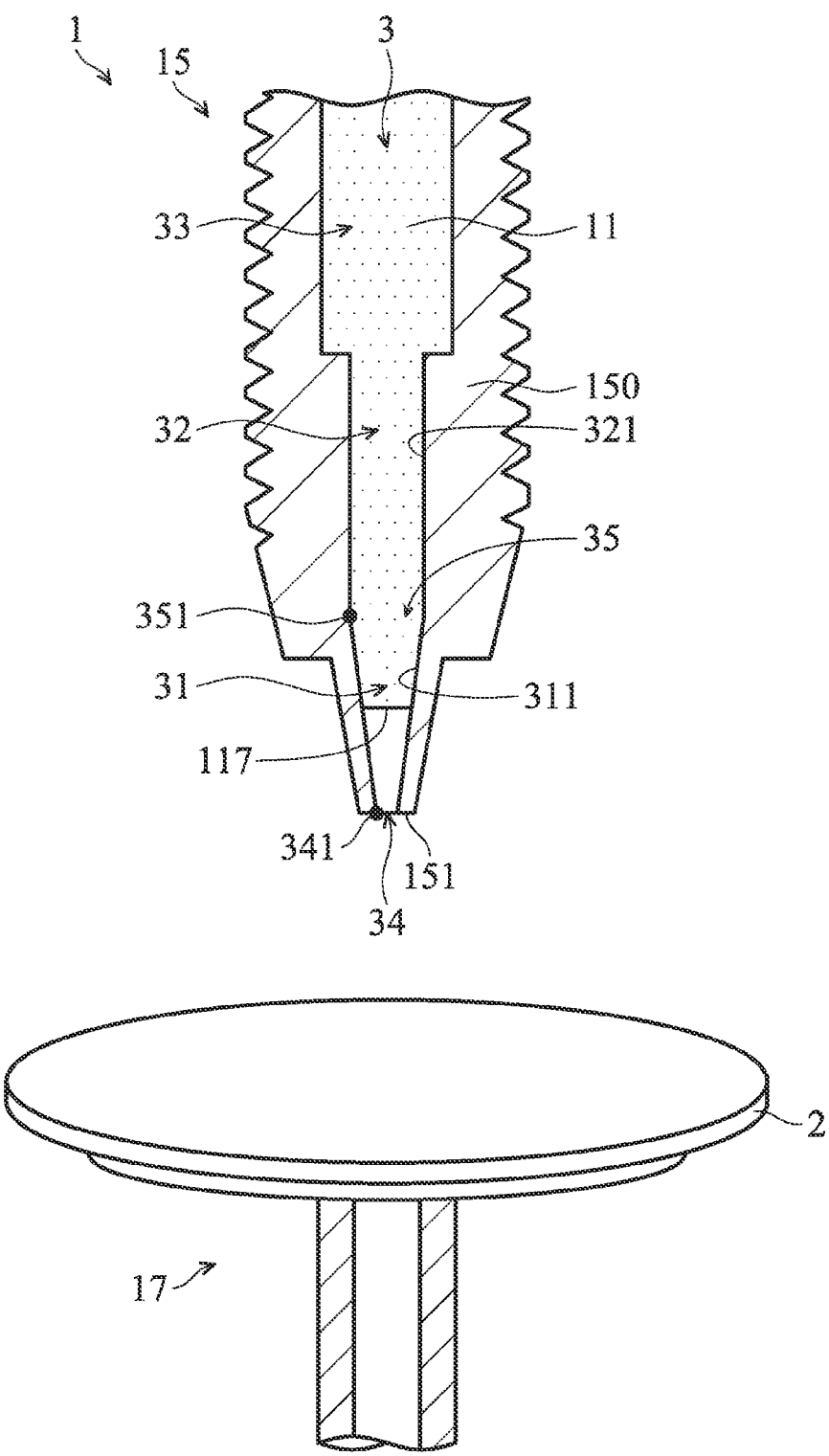
FIGS. 5A-5E show schematic cross-sectional views of various stages of a process for providing a chemical solution on a substrate, in accordance with some embodiments.

Referring to FIGS. 4 and 5A, the method 500 begins with an operation 501 in which a chemical solution (such as the chemical solution 11) is injected into a flow path (such as the flow path 3) of a spray nozzle (such as the spray nozzle 15). In some embodiments, the chemical solution 11 is injected into the flow path 3 formed in the spray nozzle 15 via the conduit 16 (FIG. 1). After the chemical solution 11 flows into the flow path 3, a front surface 117 of the chemical solution 11 may be located at any position of the flow path 3.

In some embodiments, after the chemical solution 11 is injected into the flow path 3, the nozzle 15 is inspected by a machine operator. If the front surface 117 of the chemical solution 11 is not located between the edge 341 of the first opening 34 and the edge 351 of the second opening 35 (i.e. not located in the first flow path section 31), an adjustment process is performed. In the adjustment process, the machine operator may actuate the pump 12 by a control system (not shown in figures) to drive the chemical solution 11 to flow until the front surface 117 of the chemical solution 11 is located in the first flow path section 31. However, it should be appreciated that many variations and modifications can be made to the embodiments of the disclosure.

In some embodiments, if the front surface 117 of the chemical solution 11 is higher than the edge 351 of the second opening 35 and located in the second flow path section 32 or the third flow path section 33, the adjustment process is not performed. In some other embodiments, the chemical solution 11 is injected into the flow path 3 until the front surface 117 of the chemical solution 11 is aligned with the bottom surface 151 of the main body 150. In some embodiments, the pump 12 keeps the chemical solution 11 at a fixed height relative to the first opening 34 by providing a pressure which is equal to or close to the atmospheric pressure.

Figure 5B:
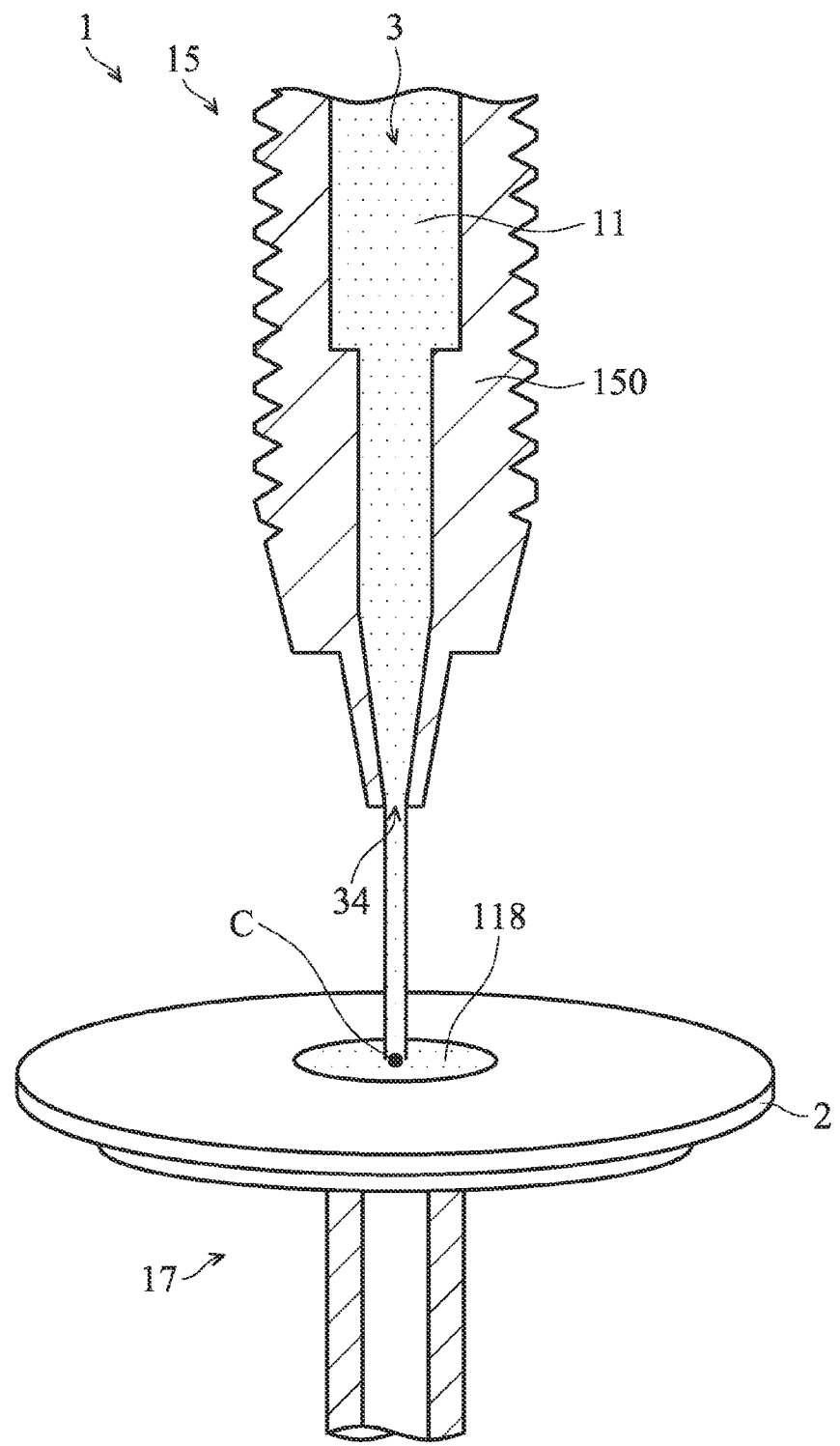

Referring to FIGS. 4 and 5B, the method 500 continues with an operation 502 in which the chemical solution 11 is dispensed over the substrate 2 via the first opening 34 of the flow path 3 formed in the nozzle 15. As shown in FIG. 5B, in some embodiments, the chemical solution 11 is supplied over the substantial center C of the substrate 2. In some embodiments, the flow rate of the chemical solution 11 is about 0.1 c.c./sec to about 1 c.c./sec in the operation of providing the chemical solution 11 over the substrate 2 via the first opening 34 of the flow path 3. A time period of the chemical solution 11 supplied over the substrate 2 may be from about 1 seconds to about 6 seconds, and the quantity of the chemical solution 118 supplied over the substrate 2 is in a range from about 0.3 c.c. to about 3.0 c.c. It is understood that the specified values are mere examples, and the supply time of the chemical solution 11 varies according to the actual quantity of the chemical solution 11 used in the semiconductor manufacturing process.

In some embodiments, since the flow rate of the chemical solution 11 is relatively slow, the chemical solution 118 which is supplied to the substrate 2 has a circular shape, and the center of the chemical solution 118 is concentric with the center C of the substrate 2. In some embodiments, during the spraying of the chemical solution 11, the substrate stage 17 moves relative to the nozzle 15, and the chemical solution 11 is supplied on different regions of the substrate 2.

Figure 5C:
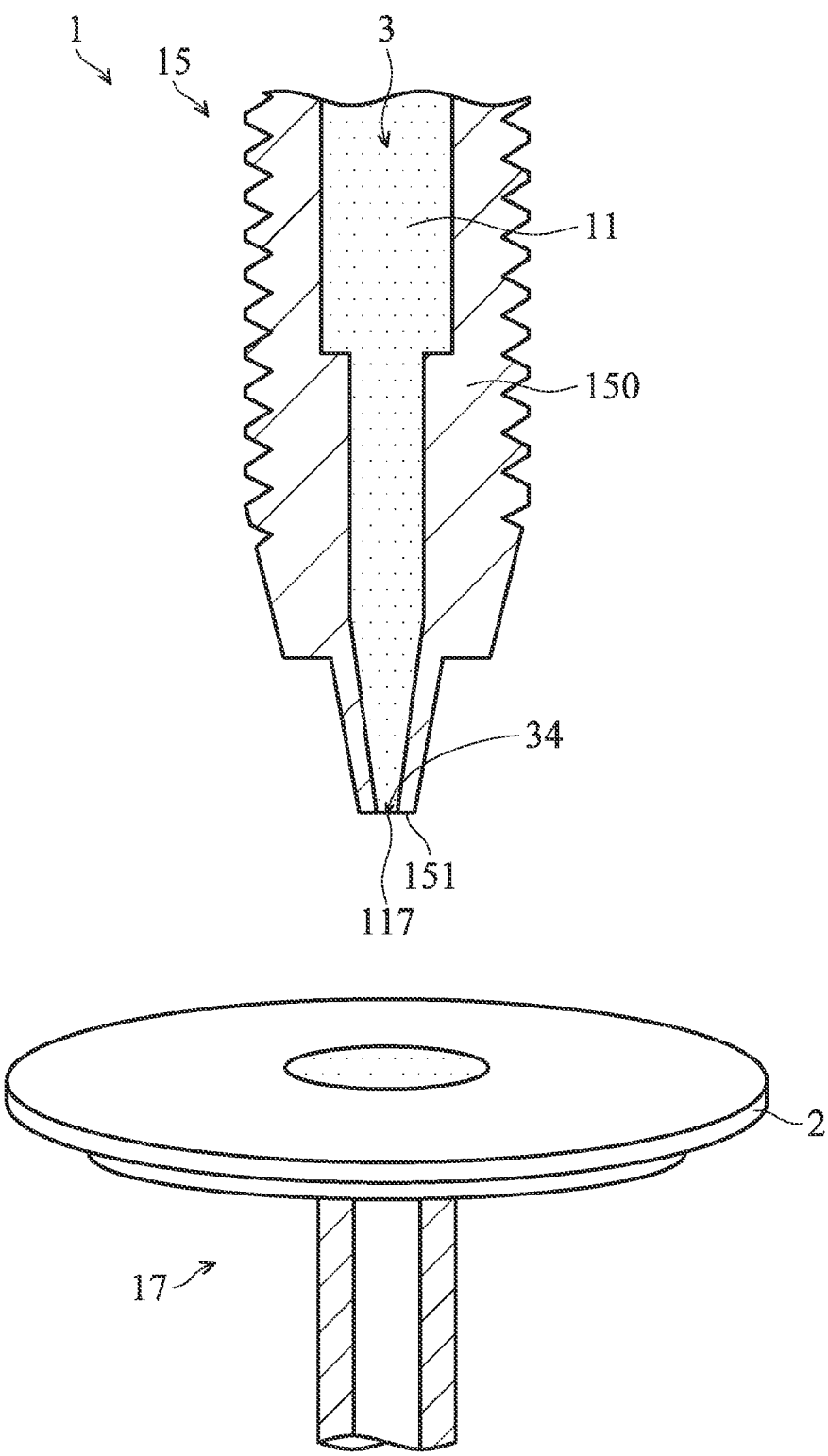

Referring to FIGS. 4 and 5C, the method 500 continues with an operation 503 in which the flow of the chemical solution 11 is cut. In some embodiments, the flow of the chemical solution 11 is cut by shutting off the valve 14 (FIG. 2). In some embodiments, the flow of the chemical solution 11 is cut by stopping the operation of the pump 12 (FIG. 2). In some embodiments, after the flow of the chemical solution 11 is cut, a portion of the chemical solution 11 is embossed from the bottom surface 151 of the main body 150 and is kept from dropping out of the nozzle 15 by surface tension. In some embodiments, after the flow of the chemical solution 11 is cut, a small quantity of the chemical solution 11 keeps running out of the first opening 34 even when the pump 12 has stopped.

Figure 5D:
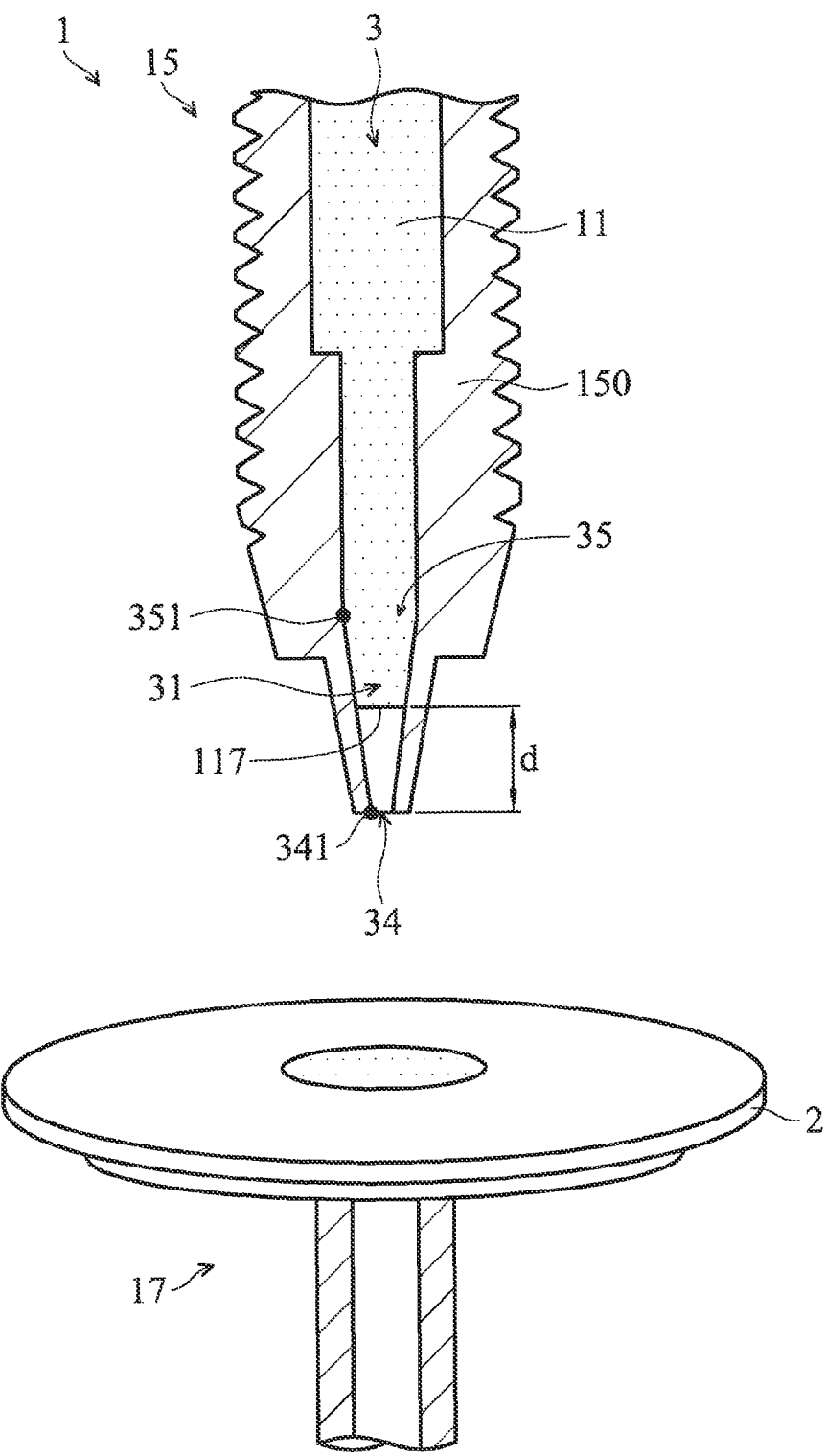

Referring to FIGS. 4 and 5D, the method 500 continues with an operation 504 in which the chemical solution 11 is sucked back, and the front surface 117 of the chemical solution 11 is moved away from the first opening 34 of the flow path 3. In some embodiments, a space of the first flow path section 31 is not occupied by the chemical solution 11 after the chemical solution is sucked back, and a volume of the space ranges from about 1.66 mm$^3$ to about 84.93 mm$^3$.

In some embodiments, the pump 12 is actuated to suck back the chemical solution 11 by producing a pressure which is equal to or as close to the atmospheric pressure. In some embodiments, to such back a predetermined quantity of the chemical solution, the pump 12 produces the same pressure to suck back the chemical solution 11 in the flow path 3 as that used to suck back the chemical solution 11 in a straight type (i.e. without a tapered flow path section) flow path having a larger outlet opening width. As a result, the control parameters of the pump 12 may be remained unchanged after the substitution of different nozzles. In some embodiments, the operation 504 is performed once the operation 502 is completed. The operation 503 may be omitted.

Referring to FIGS. 4 and 5D, the method 500 continues with an operation 505 in which the chemical solution 11 in the flow path 3 is held, and a front surface 115 of the chemical solution 11 is located in a tapered flow path section (such as the first flow path section 31) of the flow path 3. In some embodiments, the front surface 115 of the chemical solution 11 is located between the edge 341 of the first opening 34 and the edge 351 of the second opening 35. The front surface 117 of the chemical solution 11 is spaced from the first opening 34 by a distance d. In some embodiments, the distance d is in a range from about 1 mm to about 4 mm. However, it should be appreciated that many variations and modifications can be made to the embodiments of the disclosure.

In some embodiments, after the chemical solution 11 is sucked back into the flow path 3, the nozzle 15 is visually observed by a machine operator. If the front surface 117 of the chemical solution 11 is not located between the edge 341 of the first opening 34 and the edge 351 of the second opening 35 (i.e. not located in the tapered flow path section 31), an adjustment process is performed. In the adjustment process, the machine operator may actuate the pump 12 by a control system (not shown in figures) to drive the chemical solution 11 to flow backward or forward until the front surface 117 of the chemical solution 11 is located in the tapered flow path section 31.

Figure 5E:
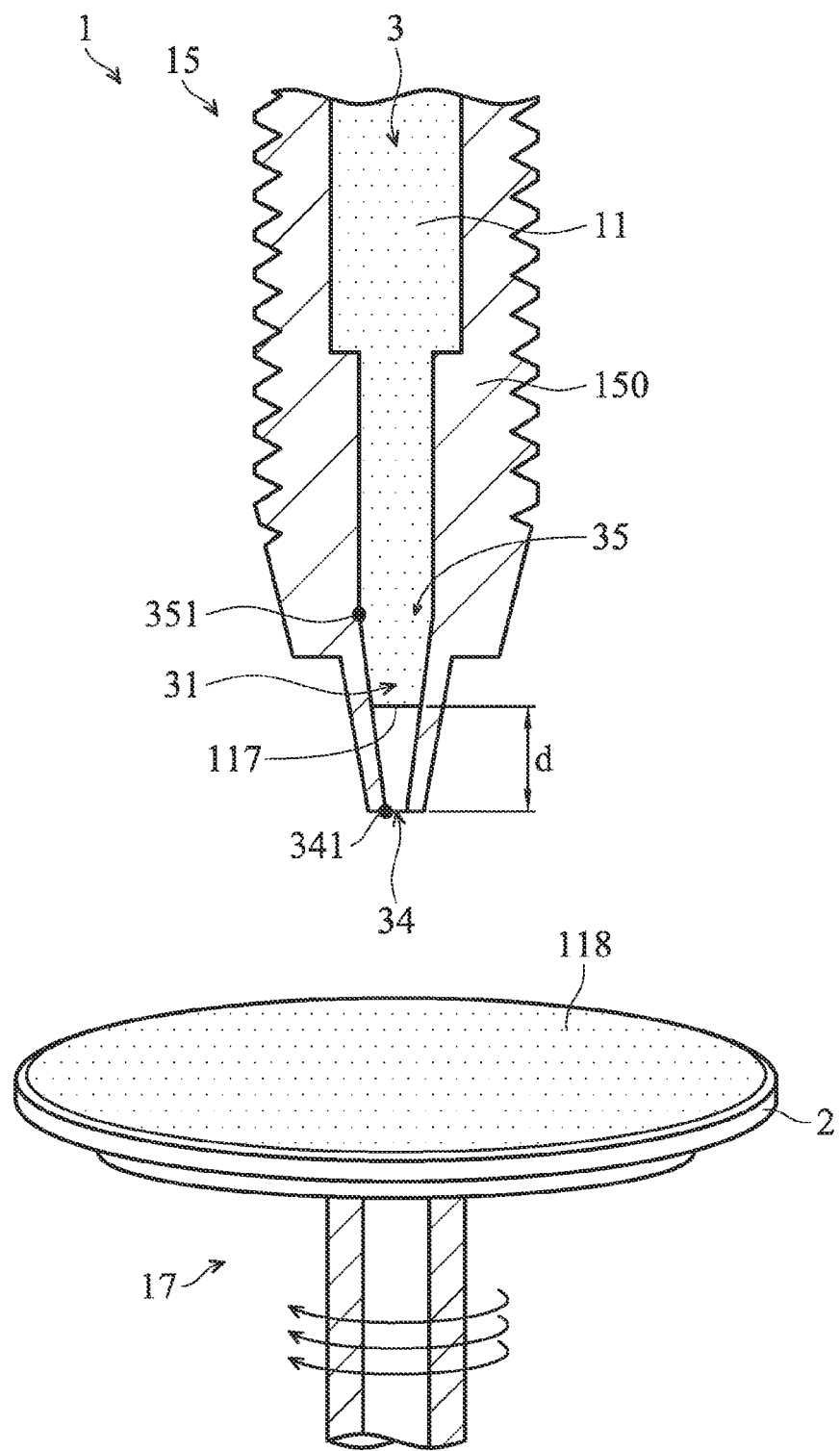

Referring to FIGS. 4 and 5E, the method 500 continues with an operation 506 in which the substrate 2 is rotated to spread the chemical solution 11 on the substrate 2. In some embodiments, the chemical solution 118 is spread radially outward from the center of the substrate 2 until the entire top surface of the substrate 2 is covered with a thin layer. Excess chemical solution 118 is spun off the rotating substrate 2 during a chemical solution coating process. In some embodiments, the substrate 2 is rotated by the substrate stage 17 at speeds up to about 5 r.p.m for a predetermined time, and a liquid layer 21 is spread over the entire surface of the substrate 2. In some embodiments, since the volume of the chemical solution 118 supplied on the substrate 2 is relatively small, the thickness of the liquid layer 21 is in a range from about 400 Å to 30000 Å. In some embodiments, due to the reduction of the chemical solution, no excess chemical solution 11 is spun off the substrate 2 during the rotation of the substrate 2.

In accordance with some embodiments, apparatuses and methods for supplying a chemical solution on a substrate are provided. The methods involve supplying the chemical solution via a nozzle with a tapered flow path section. Since the width of the outlet opening of the nozzle is decreased, the nozzle can be used to supply a small quantity of the chemical solution on the substrate. As a result, the usage of the chemical solution is reduced, and the manufacturing cost is decreased. In addition, the tapered flow path section provides sufficient space for receiving the chemical solution at a region near the outlet opening. When the chemical solution is sucked back in to the flow path, the front surface of the chemical solution is kept in the tapered flow path section. Therefore, no air bubble will be formed in the chemical solution, and the product yield may be improved.

In accordance with some embodiments, a spray nozzle is provided. The spray nozzle includes a main body. The main body extends along a longitudinal axis and has a bottom surface. The spray nozzle further includes a flow path. The flow path is formed in the main body along the longitudinal axis. The flow path includes a first opening formed on the bottom surface of the main body. An inner wall of the flow path has an inclined angle in a range from about 6 degrees to about 14 degrees relative to the longitudinal axis.

In accordance with some embodiments, a spray nozzle is provided. The spray nozzle includes a main body. The main body extends along a longitudinal axis and has a bottom surface. The spray nozzle further includes a flow path. The flow path is formed in the main body along the longitudinal axis. The flow path includes a first opening formed on the bottom surface of the main body. The flow path is tapered in a direction toward the first opening along the longitudinal axis.

In accordance with some embodiments, a method for providing a chemical solution over a substrate. The method includes providing the chemical solution over the substrate via a first opening of a flow path formed in a spray nozzle. The method further includes sucking back the chemical solution away from the first opening of the flow path. The method also includes holding the chemical solution in the flow path to keep a front surface of the chemical solution located in a tapered flow path section of the flow path.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A spray nozzle, comprising:
    a main body extending along a longitudinal axis and having a bottom surface; and
    a flow path formed in the main body along the longitudinal axis and defined by an inner wall, wherein the flow path comprises a first opening formed on the bottom surface of the main body, and in a direction away from the first opening, the flow path sequentially comprises:
    a first flow path section, connected to the first opening;
    a second flow path section immediately connected to the first flow path section via a second opening; and
    a third flow path section immediately connected to the second flow path section via a third opening, wherein the second and the third flow path both have a constant width, and the width of the third flow path is greater than the width of the second flow path;
    wherein the inner wall of the first flow path section that immediately connects the first opening to the second opening has an inclined angle relative to the longitudinal axis, the second opening and the third opening have the same width, and the first flow path section at the second opening has the same width as the third opening.

2. The spray nozzle as claimed in claim 1, wherein the inner wall of the flow path is connected with a first edge of the first opening, and a first width of the first opening ranges from about 0.8 mm to about 2.4 mm.

3. The spray nozzle as claimed in claim 1, wherein the inner wall connects the first edge of the first opening to a second edge of the second opening, wherein a distance between the first opening and the second opening ranges from about 3 mm to about 10 mm.

4. The spray nozzle as claimed in claim 1, wherein the inner wall connects the first edge of the first opening to a second edge of the second opening, wherein a ratio of a second width of the second opening and the first width of the first opening ranges from about 1.01 to about 12.5.

5. The spray nozzle as claimed in claim 1, wherein the first flow path section has a circular cross-sectional shape, and a cross-sectional area of the first flow path section is gradually increased away from the first opening along the longitudinal axis.

6. The spray nozzle as claimed in claim 1, wherein the main body is made of a transparent material.

7. The spray nozzle as claimed in claim 1, wherein the bottom surface is an inclined surface with an increasing height along a direction approaching a center of the bottom surface.

8. The spray nozzle as claimed in claim 1, wherein the flow path is tapered in a direction toward the first opening along the longitudinal axis.

9. The spray nozzle as claimed in claim 1, wherein a second width of the second opening along a direction perpendicular to the longitudinal axis is in a range of about 1.21 mm to about 5 mm.

10. The spray nozzle as claimed in claim 1, wherein the flow path comprises a connecting wall connecting the inner wall of the first flow path section and the inner wall of the second flow path section, wherein the connecting wall extends along a direction perpendicular to the longitudinal axis.

11. The spray nozzle as claimed in claim 1, wherein an edge of the second opening is immediately connected to the inner wall of the first flow path section that is inclined relative to the longitudinal axis, and the edge of the second opening is immediately connected to the inner wall of the second flow path section that is parallel to the longitudinal axis.

12. The spray nozzle as claimed in claim 1, wherein an outer surface of the main body at the first section is tapered toward the bottom surface.

13. A spray nozzle, comprising:
    a main body extending along a longitudinal axis and having a bottom surface; and
    a flow path formed in the main body along the longitudinal axis and comprising a first opening formed on the bottom surface of the main body, wherein in a direction away from the first opening, the flow path sequentially comprises:
    a first flow path section immediately connected to the bottom surface, wherein the first flow path is tapered in a direction toward the first opening along the longitudinal axis;
    a second flow path section immediately connected to the first flow path section via a second opening; and
    a third flow path section immediately connected to the second flow path section via a third opening, wherein the second opening and the third opening have the same width, and the first flow path section at the second opening has the same width as the third opening;
    wherein the second and the third flow path both have a constant width, and the width of the third flow path is greater than the width of the second flow path.

14. The spray nozzle as claimed in claim 13, wherein the first flow path section of the flow path comprises an inner wall connected with a first edge of the first opening that is formed on the bottom surface and having an inclined angle of about 6 degrees to about 14 degrees relative to the longitudinal axis.

15. The spray nozzle as claimed in claim 14, wherein the inner wall connects a first edge of the first opening to a second edge of the second opening, wherein a volume of the flow path from the first opening to the second opening ranges from about 1.66 mm$^3$ to about 84.93 mm$^3$.

16. The spray nozzle as claimed in claim 14, wherein the inner wall connects the first opening to the second opening, wherein a first width of the first opening ranges from about 0.8 mm to about 2.4 mm, and a ratio of a second width of the second opening and the first width of the first opening ranges from about 1.01 to about 12.5.

17. The spray nozzle as claimed in claim 13, wherein the main body is made of a transparent material.

18. The spray nozzle as claimed in claim 13, wherein the bottom surface is an inclined surface with an increasing height along a direction approaching a center of the bottom surface.

19. The spray nozzle as claimed in claim 13, wherein a second width of the second opening along a direction perpendicular to the longitudinal axis is in a range of about 1.21 mm to about 5 mm.

20. The spray nozzle as claimed in claim 13, wherein the flow path is defined by an inner wall and comprises a connecting wall connecting the inner wall of the first flow path section and the inner wall of the second flow path section, wherein the connecting wall extends along a direction perpendicular to the longitudinal axis.

* * * * *